United States Patent [19]

Nicollini

[11] Patent Number: 4,899,069
[45] Date of Patent: Feb. 6, 1990

[54] INTEGRATED ACTIVE LOW-PASS FILTER OF THE FIRST ORDER

[75] Inventor: Germano Nicollini, Piacenza, Italy

[73] Assignee: SGS-Thomson Microelectronics s.r.l., Brianza, Italy

[21] Appl. No.: 285,204

[22] Filed: Dec. 16, 1988

[30] Foreign Application Priority Data

Dec. 22, 1987 [IT] Italy .................. 83685 A/87

[51] Int. Cl.$^4$ .................. H03B 1/00; H03K 5/00
[52] U.S. Cl. .................. 307/520; 328/167; 333/173; 330/109
[58] Field of Search ............... 307/520, 521; 328/127, 328/167; 330/9, 107, 109; 333/173

[56] References Cited

U.S. PATENT DOCUMENTS 4,453,130  6/1984  Bennett ................. 528/127
4,513,265  4/1985  Sokoloff ............... 333/173
4,633,223  12/1986  Senderowicz ........... 330/09

Primary Examiner—John S. Heyman
Assistant Examiner—Timothy P. Callahan
Attorney, Agent, or Firm—Bierman and Muserlian

[57] ABSTRACT

An integrated, low-pass filter of the first order made using the switched capacitors technique utilizes advantageously a single switched capacitor and only two switches in contrast to the filters of the prior art which utilize two switched capacitors and four switches. The filter of the invention requires a smaller integration area and moreover exhibits a greater precision of its DC gain.

1 Claim, 1 Drawing Sheet

INTEGRATED ACTIVE LOW-PASS FILTER OF THE FIRST ORDER

BACKGROUND OF THE INVENTION

1. Field of the Invention

The present invention relates to integrated circuits and in particular to integrated active filters.

2. Description of the Prior Art

Filters for selective frequency filtering of signals are most common circuits within analog electronic systems. Along with the development of large scale integration techniques, it has become ever more important to develop techniques for efficiently implementing these filters. In many applications a large number of filters, monolithically integrated together with the ancillary circuitry for implementing certain system's functions, are required and it is desirable that the filters be wholly integrated, that they do not require adjustment and that they occupy as little area as possible on the silicon chip.

Passive filters don't lend themselves to integration for various reasons along which the inadequate precision of the R and C values in integrated form, as well as the fact that the output impedance is tied to R and C values, i.e. to the filtering function, and therefore in case a resistive and/or capacitive load is driven, this would modify the transfer function of the filter itself thus modifying both the DC gain and the cut-off frequency.

In integrated circuits, active filters employing an operational amplifier with a suitable feedback network are almost exclusively employed in order to implement the desired transfer function. Moreover in order to obviate also to the above recalled problem of precision of the cut-off frequency value, which remains tied to the values of the integrated R and C, the resistance R is commonly substitute by a capacitance Cx, switched at a frequency $f_s$. As it is well known to the expert technician such a switched capacitor behaves electrically as a resistance having a value given by:

$$Rx = \frac{1}{f_s Cx}$$

According to the known technique it is necessary to use at least two switched capacitors and four switching f o r realizing a low-pass filter of the first order.

OBJECTIVES AND SUMMARY OF THE INVENTION

A main objective of the present invention is to provide an active low-pass filter of the first order which utilizes a lower number of components than the number of components utilized by a similar filter made in accordance with the prior art and which requires a smaller area of integration.

This and other objectives and advantages of the active low-pass filter of the first order of the present invention are achieved by employing a single switched capacitor and only two switching means, arranged as defined in the annexed claims.

BRIEF DESCRIPTION OF THE DRAWINGS

The different aspects and advantages of the invention will be more easily understood through the following description with reference to the annexed drawing wherein.

DESCRIPTION OF THE PREFERRED EMBODIMENT

Figure 1:
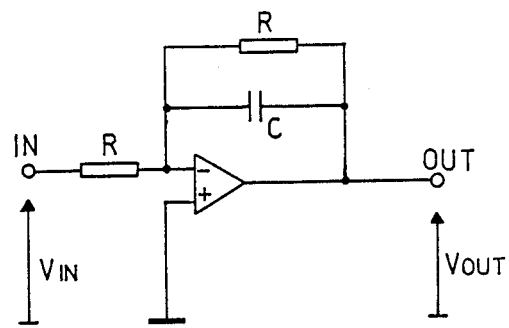
FIG. 1 is a diagram of a low-pass active filter of the first order.
Figure 2:
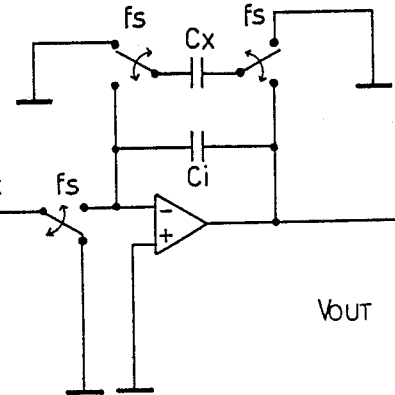
FIG. 2 is a circuit diagram of the low-pass active filter of the first order of FIG. 1, made with switched capacitors in accordance with the known technique.

For better pointing out the characteristics of the invention, in FIGS. 1 and 2 the diagrams of an active low-pass filter of the first order made according to the prior art are illustrated. In relation to the diagram of FIG. 1, the cut-off frequency of the filter (defined on the dynamic characteristic at the point where the modulus of the transfer function is reduced by $-3$ dB in respect to the DC gain, which is substantially equal to unity) is given by:

$$\frac{1}{2\pi RC}$$

and it is hardly controllable because of the difficulty of obtaining very precise absolute values of resistance in integrated (diffused) resistors, which furthermore have rather poor linearity and temperature coefficient characteristics besides requiring a relatively large area of integration on the silicon chip. Furthermore, the DC gain is affected by the ratio between the two equal resistances (R), which is also hardly controllable in terms of precision ($\pm 0.5\%$).

The known solution depicted in FIG. 2 overcomes these problems by exploiting the switched capacitor technique for functionally substituting the two equal resistors (R) of the basic circuit diagram of FIG. 1.

Each of the two switched capacitances Cx, switched at the $f_s$ frequency, electrically behaves as a resistor having a value given by:

$$Rx = \frac{1}{f_s Cx}$$

The DC gain of these filters is very precise, because it is determined by the ratio between the two identical switched capacitances (Cx), which according to modern fabrication techniques of integrated circuits has a precision of about $\pm 0.1\%$.

The cut-off frequency of the filter, which is given by:

$$\frac{f_s Cx}{2\pi Ci}$$

is also precisely presettable because it is determined by a ratio between two integrated capacitors (the precision of which, as already said, may be 0.1%) and by the value of the switching frequency $f_s$, which is normally obtained by means of an external quartz oscillator and is therefore highly precise ($\pm 0.01\%$).

In practice all active low-pass filters of the first order having a high precision, implemented in integrated circuits (especially in CMOS circuits), have the circuit diagram of FIG. 2, that is an operational amplifier, a continuous integration capacitance Ci, two switched capacitances Cx and four switches operating at the frequency $f_s$, as shown in the circuit diagram of FIG. 2.

The maximum precision, both on the DC gain and on the cut-off frequency is of about 0.1%.

Figure 3:
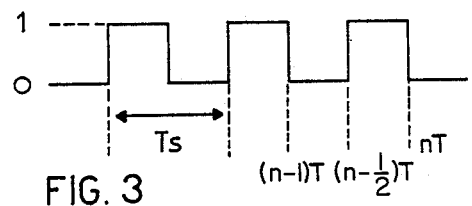
FIG. 3 is the wave shape of the switching signal (clock signal)

The wave shape of the switching signal is shown in FIG. 3, the switching frequency being $f_s = 1/T_s$, where $T_s$ is the sampling period.

Figure 4:
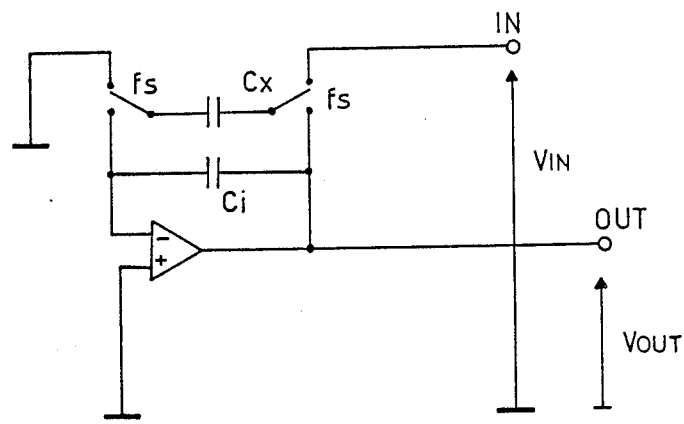
FIG. 4 is a circuit diagram of a low-pass active filter of the first order made in accordance with the present invention.

The active low-pass filter of the present invention has a circuit diagram as shown in FIG. 4 and, in contrast to the low-pass active filters of the prior art, utilizes a single switched capacitor Cx and only two switches driven at the frequency $f_s$.

Essentially the active low-pass filter of the first order of the invention comprises an operational amplifier having an inverting input and a noninverting input and a single output coinciding with the output terminal of the filter and the operational amplifier is provided with a negative feedback network which comprises a continuous integration capacitor Ci, which is connected between the output terminal of the filter and the inverting input terminal of the operational amplifier, while the noninverting ting input of the operational amplifier is connected to ground. A single switched capacitor Cx and the two switches driven at the frequency $f_s$ are connected so that a first armature of the switched capacitor is switched by a first one of said two switches between the inverting input of the operational amplifier and the circuit's ground node. The second armature of the switched capacitor is switched by the other of said two switches between an input terminal of the filter and the output terminal thereof.

An analysis of the operation of the circuit of the active low-pass filter of the first order of the invention is herein shown, by utilizing the time scale indicated in the diagram of FIG. 3.

$$V_{out}[nT] = V_{out}\left[\left(n - \frac{1}{2}\right)T\right]$$

$$(Ci + Cx) V_{out}\left[\left(n - \frac{1}{2}\right)T\right] = Ci\, V_{out}[(n-1)T] + Cx\, V_{in}[(n-1)T]$$

$$V_{out}[nT] = \frac{Ci}{Ci + Cx} V_{out}[(n-1)T] + \frac{Cx}{Ci + Cx} V_{in}[(n-1)T]$$

by introducing the z- transform:

$$V_{out}(z) = \frac{Ci}{Ci + Cx} V_{out}(z) z^{-1} + \frac{Cx}{Ci + Cx} V_{in}(z) z^{-1}$$

$$\frac{V_{out}(z)}{V_{in}(z)} = \frac{z^{-1}}{1 + \frac{Ci}{Cx}(1 - z^{-1})}$$

As it is well known to the expert technician, the frequency response of the system is obtained by substituting $e^{j2\pi f T_s}$ in place of z; where Ts is the sampling period of the circuit and f is the current frequency.

It may be immediately observed that the DC gain (i.e. f=0 and therefore z=1) is 1, i.e. 0 dB, the cut-off frequency of the filter, as already indicated before, is given by:

$$\frac{f_s\, Cx}{2\pi Ci}.$$

In respect to the known solutions, the integrated low-pass, active filter of the first order of the invention offers the advantage of requiring a reduced number of components thus permitting to save integration area. Furthermore, the DC gain of the filter has an infinite precision because it is no longer dependent from the precision of a ratio between integrated capacitors, as in the filters of the prior art.

What I claim is:

1. An integrated, low-pass, active filter of the first order operable for producing an output signal at an output terminal thereof in function of a signal applied to an input terminal thereof and comprising an operational amplifier having an inverting input and a noninverting input and a single output coinciding with said output terminal of the filter and provided with a negative feedback network which comprises a continuous integration capacitor connected between said output terminal of the filter and said inverting input of the operational amplifier, the noninverting input of which being connected to ground, and characterized by comprising a single switched capacitor and two switches operating at a preset frequency;

a first armature of said switched capacitor being switched by a first one of said two switches between said inverting input of the operational amplifier and ground;

a second armature of said switched capacitor being switched by the other of said two switches between said input terminal and said output terminal of the filter.

* * * * *